United States Patent [19]

Inoue

[11] 4,355,414
[45] Oct. 19, 1982

[54] AUTOMATIC GAIN CONTROL SYSTEM

[75] Inventor: Shigeki Inoue, Toyokawa, Japan

[73] Assignee: Hitachi, Ltd., Tokyo, Japan

[21] Appl. No.: 188,095

[22] Filed: Sep. 17, 1980

[30] Foreign Application Priority Data

Sep. 19, 1979 [JP] Japan .................................. 54-119405

[51] Int. Cl.³ .............................................. H04B 1/10
[52] U.S. Cl. ..................... 455/184; 455/177; 455/194; 455/249; 455/250; 455/295; 455/296; 455/183
[58] Field of Search ............... 455/154, 161, 165, 169, 455/177, 179, 183, 184, 185, 186, 194, 205, 206, 234, 249, 250, 295, 296, 311, 312; 323/352, 353; 307/540, 549

[56] References Cited

U.S. PATENT DOCUMENTS

| | | | |
|---|---|---|---|
| 3,886,457 | 5/1975 | Petaja | 455/249 |
| 4,126,828 | 11/1978 | Kumagai | 455/295 |
| 4,254,506 | 3/1981 | Henderson et al. | 455/186 |

Primary Examiner—Benedict V. Safourek
Attorney, Agent, or Firm—Antonelli, Terry & Wands

[57] ABSTRACT

An automatic gain control for a receiver includes a gain controller for controlling the gain of the receiver, a control device connected to the tuning device of the receiver for varying and controlling the tuning frequency of the tuning device, and a level detector connected to the control device and the receiving signal system of the receiver for detecting the receiving level. The control device includes a calculation processor connected to the tuning device, the level detector and the gain controller, and the calculation processor includes a detector for detecting the absence or presence of other broadcasting waves (interference waves) in a predetermined relation with the receiving frequency of the receiver and for controlling the gain controller in such a manner as to reduce the gain thereof when the signal intensity of the interference broadcasting waves exceeds a predetermined level predetermined by the level detector.

8 Claims, 13 Drawing Figures

FIG. 4a
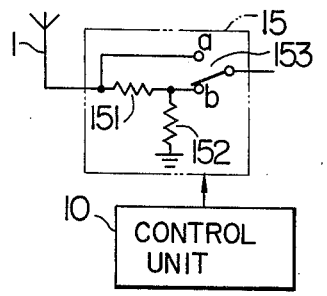
FIG. 4b
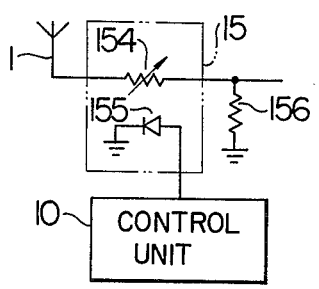
FIG. 6
| FREQUENCY (fs) | FREQUENCY V.C.O | PROGRAMMABLE DIVIDER INPUT | REFERENCE OSC FREQUENCY |
|---|---|---|---|
| 88.3 MHz | 99.0 MHz | 990 | 100 KHz |
| 88.7 | 99.4 | 994 | 100 |
| 89.1 | 99.8 | 998 | 100 |
| 89.5 | 100.2 | 1002 | 100 |
| ⋮ | ⋮ | ⋮ | ⋮ |
| 107.5 | 118.2 | 1182 | 100 |
| 107.9 | 118.6 | 1186 | 100 |
FIG. 7
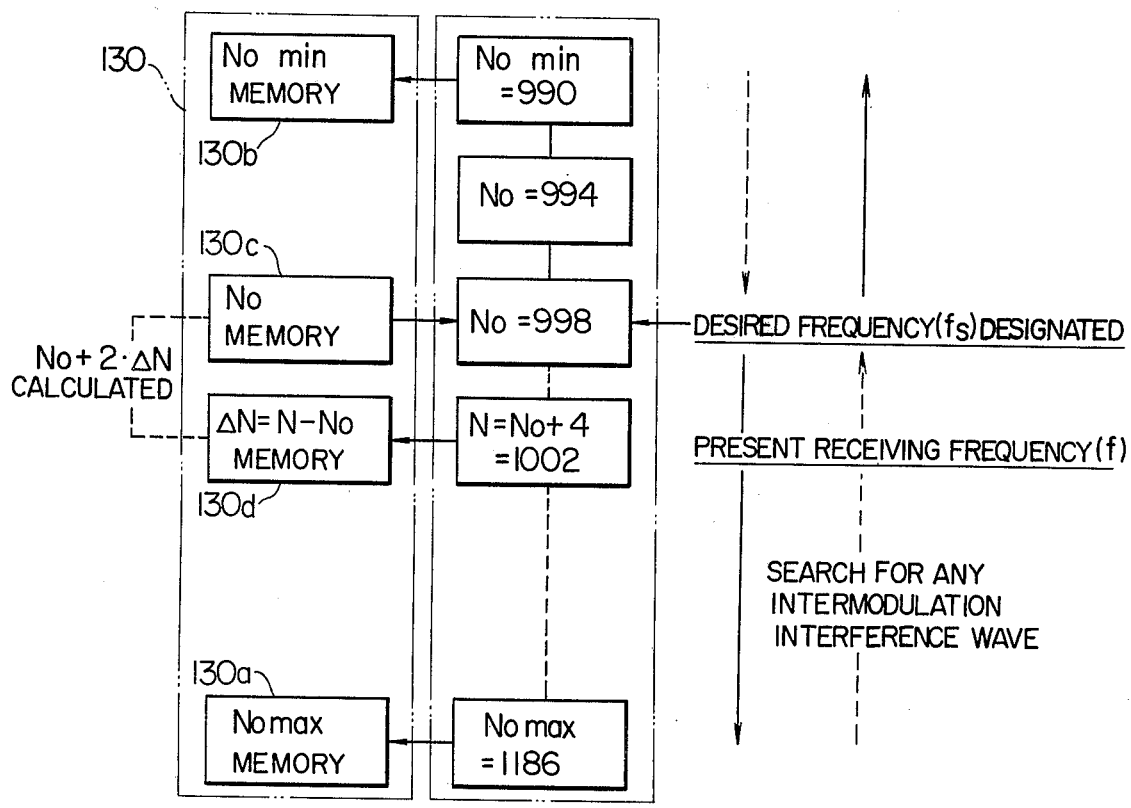

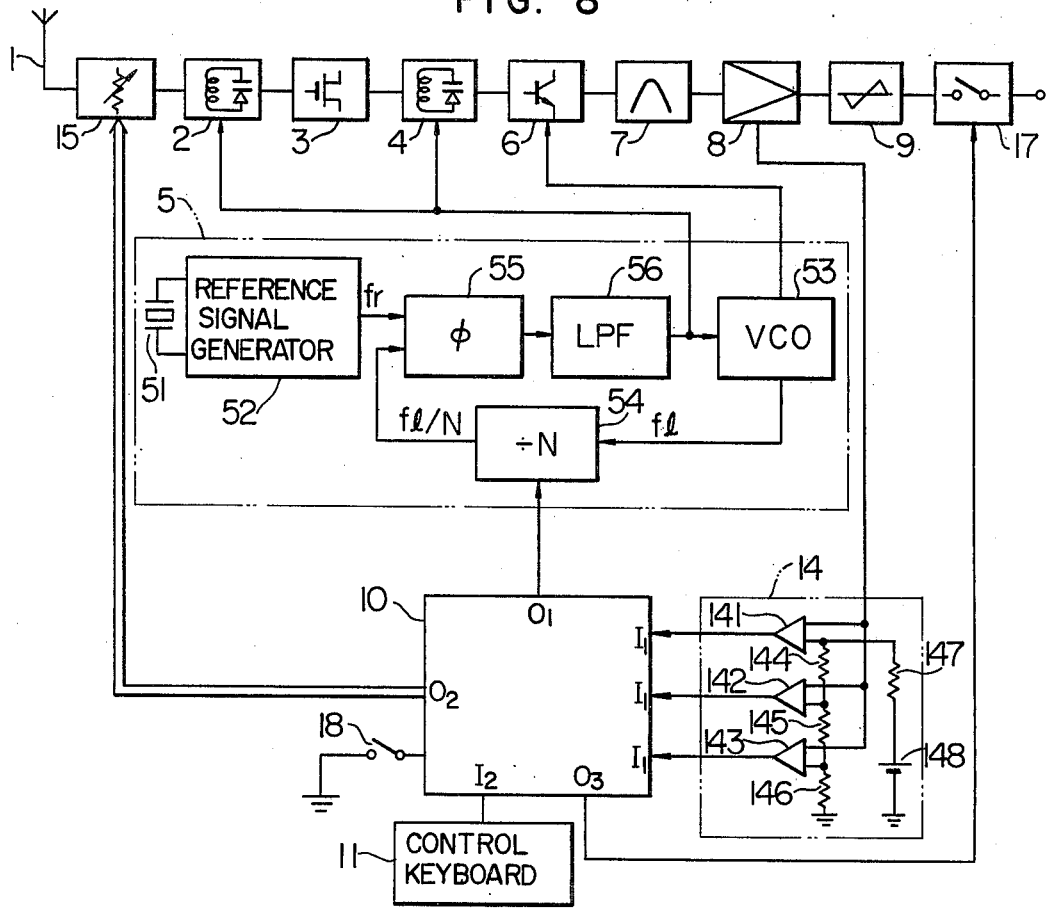

FIG. 10
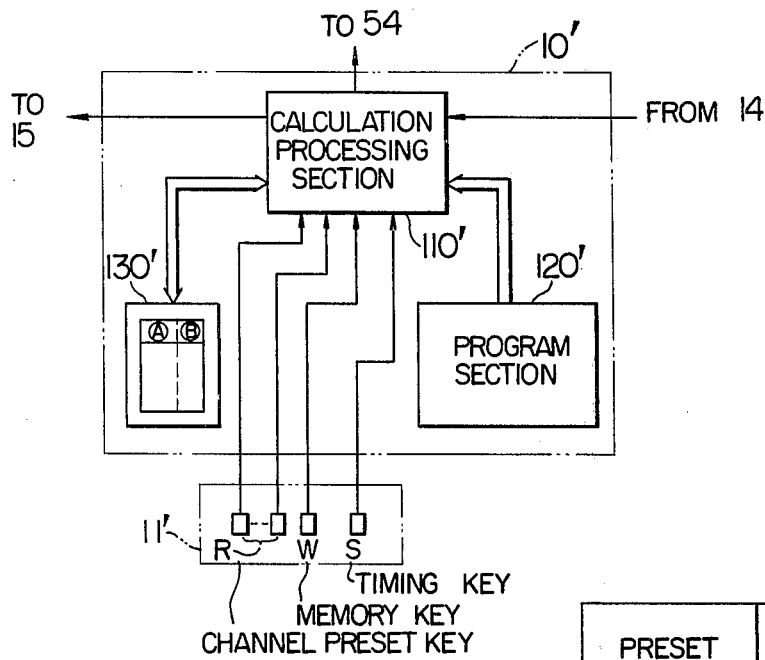
FIG. 11
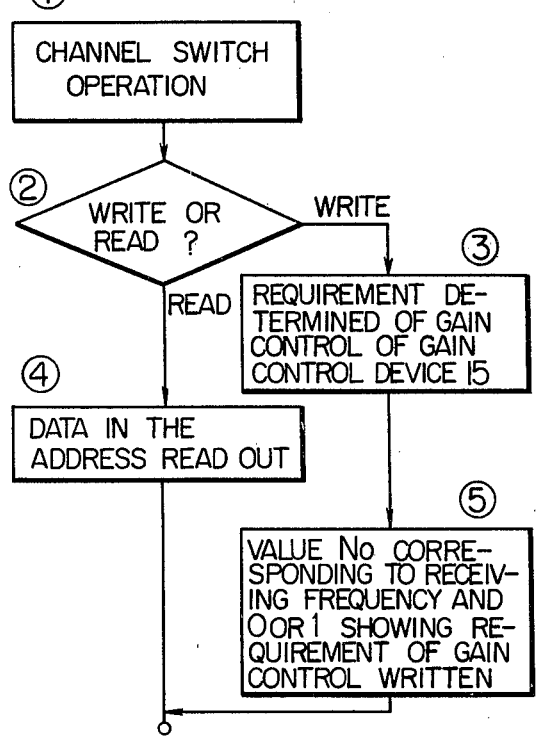
FIG. 12
| PRESET CHANNEL (CH) | MEMORY DATA | |
|---|---|---|
| | Ⓐ FREQUENCY (FREQUENCY DIVIDING VALUE No) | Ⓑ REQUIREMENT OF GAIN CONTROL |
| 1 | 88.3 (990) | 0 |
| 2 | 88.7 (994) | 1 |
| ⋮ | ⋮ | ⋮ |
| 5 | 89.9 (1006) | 0 |
| ⋮ | ⋮ | ⋮ |
| n | 107.9 (1186) | 1 |

AUTOMATIC GAIN CONTROL SYSTEM

BACKGROUND OF THE INVENTION

1. Field of the Invention

This invention relates to an automatic gain control system suitably used for a radio receiver.

2. Description of the Prior Art

FM radio broadcasts are widely enjoyed for their high sound quality. In view of the multiplicity of broadcasting stations now established, however, a serious problem of interference arises in which the sound quality of the desired channel of broadcasting is adversely affected by the transmissions of other stations. Especially, intermodulation distortion, which causes uncomfortable noises such as birdy noise resulting from the beating of a second signal with the desired receiving signal, is required to be reduced to the greatest extent possible.

Intermodulation distortion is a phenomenon caused by the nonlinear characteristics of an amplifier element or a mixing element of a receiver, which elements generate a spurious frequency spectrum, by interference between two or more different electric waves, as if there exists another electric wave at that beat frequency different from the frequencies of the first-mentioned electric waves. Assume, for instance, that an amplifier element has a nonlinear transmission characteristic as shown by equation (1) below.

$$I = a_0 + a_1 v + a_2 v^2 + a_3 v^3 + \ldots \quad (1)$$

where

I: output current, and
v: input voltage

If there are two input signals whose frequencies are $f_1$ and $f_2$ in the equation (1), $$I = a_0 + a_1(v_1 \sin \omega_1 t + v_2 \sin \omega_2 t) + a_2(v_1 \sin \omega_1 t + v_2 \sin \omega_2 t)^2 + a_3(v_1 \sin \omega_1 t + v_2 \sin \omega_2 t)^3 \ldots \quad (2)$$

where $v_1$ and $v_2$ are signal voltages of $f_1$ and $f_2$, respectively, $\omega_1: 2\pi f_1$, and
$\omega_2: 2\pi f_2$ The fourth term, namely, the cubic term of equation (2) above is expanded by use of a trigonometric formula.

$$\tfrac{3}{4} a_3 v_1^2 v \sin 2\pi(2f_1 - f_2)t \quad (3)$$

$$\tfrac{3}{4} a_3 v_1 v_2^2 \sin 2\pi(2f_2 - f_1)t \quad (4)$$

Equations (3) and (4) involve spectra of $(2f_1 - f_2)$ and $(2f_2 - f_1)$. In this case, if $f_2$ is considered equal to $f_1 + \Delta f$, the spectra of equations (3) and (4) occur at $f_1 - \Delta f$ and $f_1 + 2\Delta f$ respectively as shown by dashed lines in FIG. 1. When the receiving frequency of a receiver is tuned to $f_1 - \Delta f$ or $f_1 + 2\Delta f$, therefore, a mixture of broadcastings of $f_1$ and $f_2$ is undesirably received even in the absence of a genuine signal at these tuning points.

One method to solve this problem is described below with reference to FIG. 2. In a radio frequency circuit of a radio receiver, elements having little nonlinear characteristics are used for a radio frequency amplifier ccircuit 3 and a mixer circuit 6, or the selectivity of the frequency selector circuit 2 or 4 is improved, thereby reducing the level of the interference wave applied to the mixer circuit 6. These methods have a limitation in interference wave level control, however, because these methods affect the receiving characteristics for weak input called a usable sensitivity.

Another suggested method is to control the input level of the radio frequency amplifier circuit 3 and the mixer circuit 6 by an AGC circuit 9. This method, however, does not substantially prevent the above-mentioned interference. When the receiving frequency of the receiver is tuned to, for example, $f_1 - \Delta f$ in FIG. 1, the intermediate frequencies of the outputs of the mixer circuit 6 present the same spectrum as the spectrum of FIG. 1. That is, the spectrum of FIG. 1 may be regarded as the spectrum of the intermediate frequencies corresponding to the respective radio frequencies. Thus, the intermediate frequencies for the interference waves $f_1$ and $f_1 + \Delta f$ are displaced by $\Delta f$ and $2\Delta f$, respectively from the intermediate frequency of the receiving wave of $f_1$ and hence may be attenuated by the intermediate frequency filter 7. As a result, it is difficult to obtain a sufficient AGC voltage by the electric waves causing the interference. The band-width of the intermediate frequency filter 7 is determined so as to prevent the affect of adjacent broadcast waves, and therefore it is substantially impossible ot obtain an AGC voltage by the interference wave. Thus, this expedient is almost of no use for preventing the intermodulation.

SUMMARY OF THE INVENTION

The object of the present invention is to provide an automatic gain control system which, obviating the disadvantages of the prior art systems, eliminates an intermodulation interference without adversely affecting the receiving characteristics at the time of receipt of a weak input signal.

According to the present invention, there is provided an automatic gain control system comprising a control unit having a calculation function such as a microcomputer by which the presence or absence and the intensity of other broadcasting waves which would give a frequency spectrum due to intermodulation thereof at the desired receiving frequency are determined and calculated, and the results thereof are used to control the gain of the receiver.

According to the present invention, in the case where an interference signal possible to interfere with the receipt of the desired broadcasting signal exists, the gain of the receiver is reduced, thus obviating the interference which otherwise might result from the intermodulation of the two signals. In the absence of an interference signal, on the other hand, the gain is not controlled.

BRIEF DESCRIPTION OF THE DRAWINGS

FIGS. 4a and 4b are circuit diagrams showing actual examples of a gain control system.

FIG. 6 is a diagram showing an example of the receiving frequency, programmable divider input and the like.

FIG. 7 is a diagram for explaining the receiving operation of the circuit shown in FIG. 3.

FIG. 8 is a block diagram showing another embodiment of the present invention.

FIG. 9 is a diagram showing the data stored in a memory unit included in the circuit of FIG. 8.

FIG. 10 is a diagram showing still another embodiment of the present invention using a radio receiver having a memory preset function.

FIG. 11 is a flow chart showing the process of the control unit of FIG. 10.

FIG. 12 shows a memory unit used in the control unit of FIG. 10.

DESCRIPTION OF THE PREFERRED EMBODIMENTS

Figure 1:
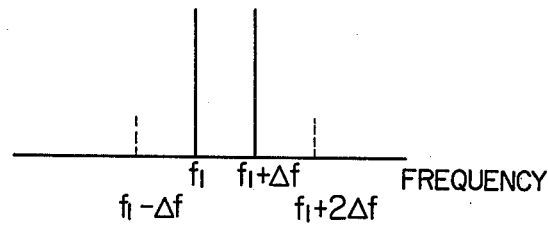
FIG. 1 is a diagram showing a frequency spectrum for explaining the intermodulation interference.
Figure 2:
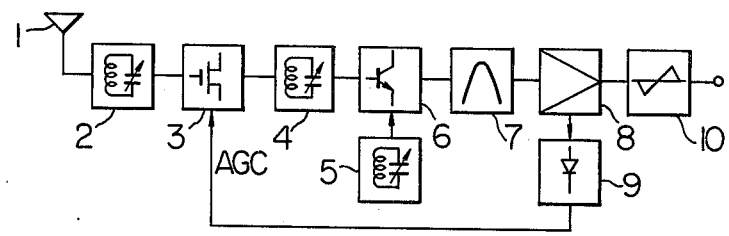
FIG. 2 is a block diagram showing the essential parts of a radio receiver.
Figure 3:
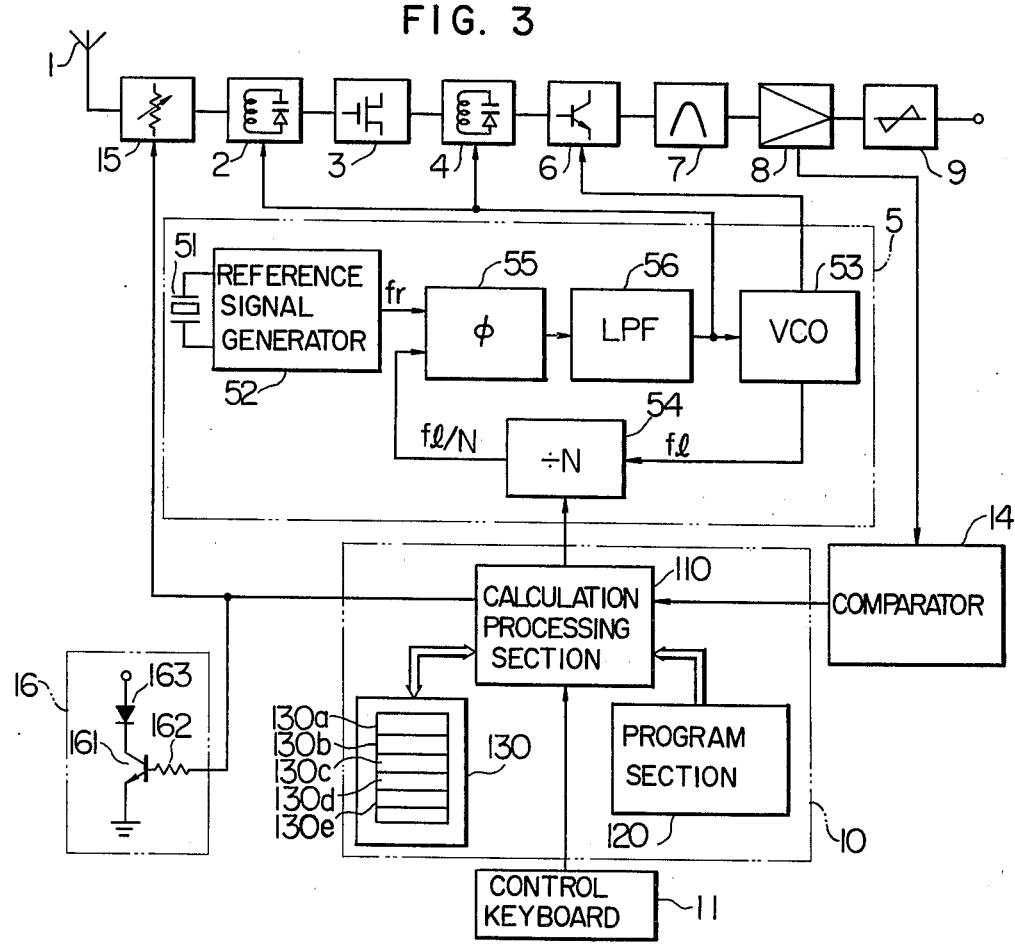
FIG. 3 is a block diagram showing an automatic gain control system according to the present invention.
Figure 5:
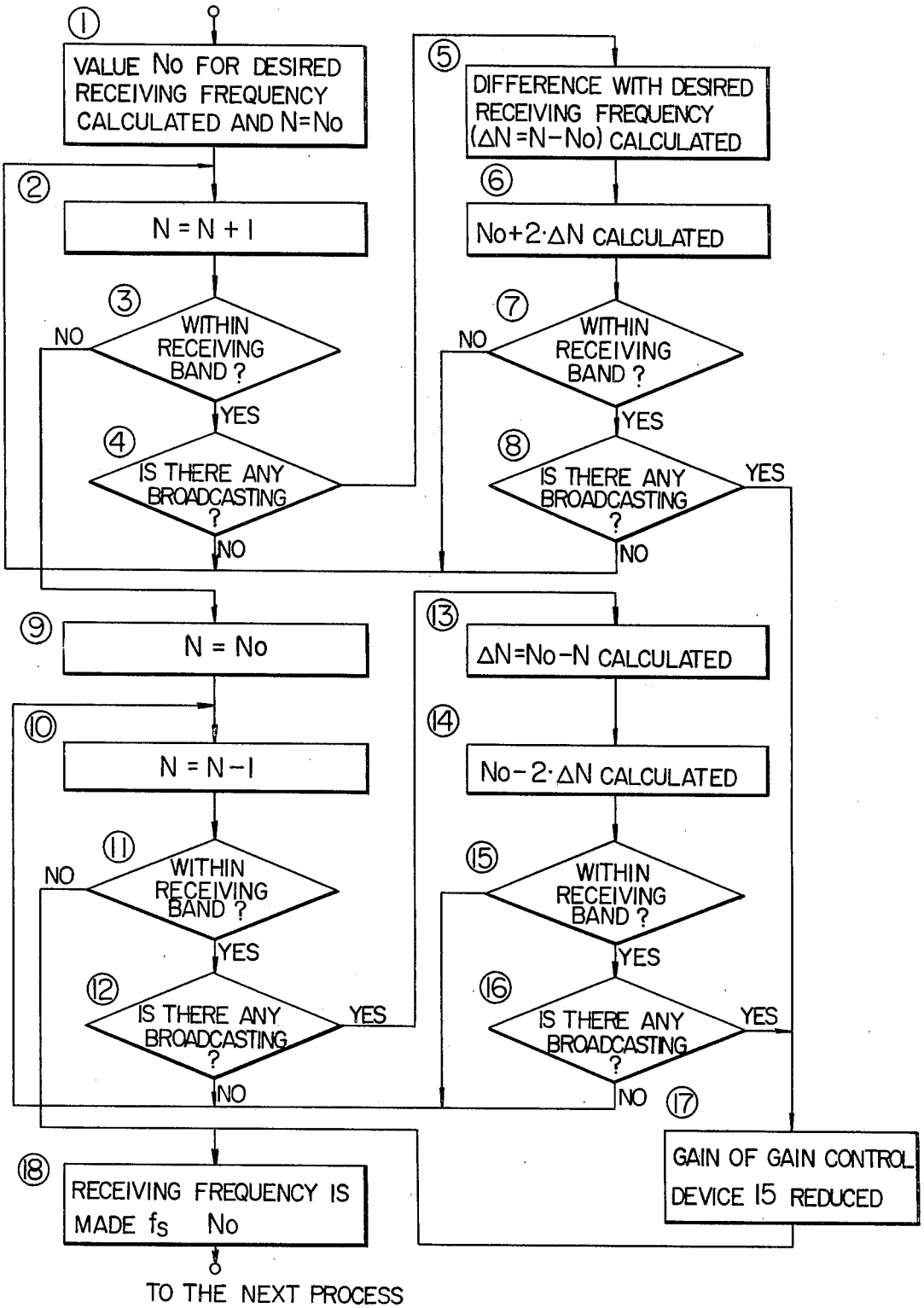
FIG. 5 is a flow chart showing the process of the control unit in FIG. 3.

Embodiments of the present invention will be described with reference to the drawings. A block diagram of an embodiment of the present invention is shown in FIG. 3. In FIG. 3, reference numeral 1 shows an antenna, numeral 2 a frequency selector circuit, numeral 3 a radio frequency amplifier circuit, numeral 4 a frequency selector circuit, numeral 5 a local oscillator circuit for a tuning device, numeral 6 a mixer circuit, numeral 7 an intermediate frequency filter, numeral 8 an intermediate frequency amplifier circuit, and numeral 9 an FM detector circuit, all of which make up a well-known superheterodyne receiver. The local oscillator circuit 5 includes a reference signal generator 52 for generating a stable reference frequency fr by means of a crystal resonator 51, a voltage controlled oscillator (VCO) 53, a programmable divider 54 for reducing the oscillation frequency fl of the oscillator 53 to fl/N, a phase comparator 55 for comparing the phases of the output frequency fl/N of the programmable divider 54 and the output frequency fr of the reference signal generator 52 with each other and detecting the phase difference therebetween thereby to produce a DC voltage corresponding to the phase difference, and a low-pass filter 56 for smoothing the output voltage of the phase comparator 55, taking out a continuous voltage component proportional to the phase difference and introducing the voltage component to the voltage controlled oscillator 53 in the next stage, all of which make up a well-known phase locked loop (PLL) circuit. If the frequency fr of the reference signal generator 52 is, say, 100 kHz, the receipt at intervals of 100 kHz is possible by changing the frequency-dividing ratio N of the programmable divider 54. Numeral 10 shows a control unit connected to the programmable divider 54 of the local oscillator 5 for controlling the dividing frequency ratio N thereof. The control unit 10 includes a memory unit 130 and a calculation processing unit 110 for performing the processing operation mentioned later as shown in FIG. 5 on the basis of the program of the program section 120. Numeral 11 shows a control keyboard for the control unit 10. Numeral 14 is a comparator inserted between the intermediate frequency amplifier 8 and the calculation processing section 110 for detecting that the receiving level of the receiver has reached a predetermined value. Numeral 15 shows a gain control unit which is inserted between the receiver antenna 1 and the frequency selector circuit 2, which is effective to control the gain of the receiver according to the output signal of the calculation processing section 110 of the control unit 10.

The gain control device 15 may comprise voltage-dividing resistors 151 and 152 and a switch 153 as shown in FIG. 4a, so that the switch 153 is operated by the control unit 10 thereby to switch the amount of attenuation of the input signal from the antenna 1. Alternatively, a cadmium sulfide (CdS) element 154 and a light-emitting element 155 are used as shown in FIG. 4b so that the resistance value of the cadmium sulfide element 154 is varied by controlling the current in the light-emitting element 155, thereby regulating the amount of signal attenuation at the cadmium sulfide element. Still another configuration of the gain control unit 15 may comprise means for changing the resonance frequency of the frequency selector circuits 2 and 4 of the receiver or changing the bias and gain of the radio frequency amplifier circuit 3. Numeral 16 is a display unit connected to the output of the calculation processing section 110 of the control unit 10 and including a transistor 161, a resistor 162 and a display element (light-emitting diode) 163. This display unit 16 is adapted to indicate that there exists a broadcasting wave having a frequency giving intermodulation to the desired broadcast wave so that the gain control operation according to the present invention is performed. Unlike in this embodiment, the display unit 16 may be driven independently by the control unit 110 instead of by a signal for controlling the gain control device 15.

The diagram of FIG. 5 shows an example of the process flow of the control unit 10 upon application thereto of a user's designation of the receiving frequency.

The operation of the embodiment of FIG. 3 will be described below with reference to the program of FIG. 5 and the receiving band specifically shown in FIG. 6. In FIG. 3, when the desired channel frequency of the receiving band such as the specific frequency (89.1 MHz) involving the receiving band as shown in FIG. 6 is designated by operation of the tuning key of the keyboard 11, the calculation processing section 110 of the control unit 10 calculates the frequency dividing value or frequency divider input No (998) corresponding to that particular frequency on the basis of the step (1) in FIG. 5. This value No is stored in the memory section 130c of the memory unit 130 on the one hand and is applied to the programmable divider 54 on the other hand. The local oscillator circuit 5 performs a PLL operation in a manner well known, thus setting the receiving frequency of the receiver at fs (89.1 MHz). In the step (2), the calculation processing section 110 adds 1 to N, and in the step (3) it is decided whether or not the resulting sum exceeds a value corresponding to the upper-limit frequency $fs_{max}$ (107.9 MHz) of the receiving band stored beforehand in the memory section 130a of the memory unit 130. If N+1 (999) is within the receiving band, this value is applied to the programmable divider 54 in the step (4) of FIG. 5, so that the receiving frequency is raised by one increment such as 100 kHz, and it is decided through the calculating processing section 110 whether or not an output is produced from the comparator 14 at this frequency, thus checking to see whether a broadcast is received.

In the absence of a broadcasting, transfer is made back to the step (2) in FIG. 5 where another "1" is added to "N" thereby to perform a similar operation and these steps are repeated. If it is found after successive increments of N that there is a broadcasting (89.5 MHz) at the step (4) of FIG. 5, for example, the calculation processing section 110 stores the instant value of N at the memory section 130d of the memory unit 130 on the one hand and the difference $\Delta N(=N-No=4)$ between the frequency now being received (namely, the value N corresponding thereto=1002) and the desired receiving frequency 89.1 MHz (namely, the value No corresponding thereto=998) is calculated on the basis of the step (5) by subtracting the value stored in the memory section 130c from the value stored in the memory section 130d on the other hand. At the step (6), a frequency (a frequency dividing value No+2·ΔN corresponding thereto) with which the receiving frequency (89.5 MHz) causes an intermodulation is calculated (89.5 MHz or 89.9 MHz is an interference frequency for the receiving frequency of 89.1 MHz). At the step (7), as at the step (3) in FIG. 5, it is decided whether or not this frequency (89.5 MHz) is included within the receiving band. If this frequency is outside of the receiving band, transfer is made back to the step (2) in FIG. 5. If it is decided at step (7) in FIG. 5 that this frequency is within the receiving band, transfer is made to the step (8) thereby to decide on the presence or absence of a broadcasting by the method similar to that for the step (4) in FIG. 5. If the broadcasting is absent, transfer is made back to the step (2) in FIG. 5, where a search is made upward to the upper-limit frequency to determine whether or not a broadcasting involving a frequency causing an intermodulation is being made. If the presence of broadcasting (89.9 MHz) is found at the step (8) in FIG. 5, it indicates the presence of a broadcasting at a frequency causing an intermodulation, in which case the calculation processing section 110 performs the control to reduce the gain of the gain control device 15 on the basis of the step (17) on the one hand and applies to the programmable divider 54 the frequency dividing value No corresponding to the desired receiving frequency fs stored in the memory section 130c on the basis of the step (18) in FIG. 5 on the other hand. This ends the receiving operation for the desired receiving frequency fs.

In the case where the receiving band is exceeded at the step (3) in FIG. 5, it is indicative of the fact that search up to the upper-limit frequency $fs_{max}$ (107.9 MHz) has been completed, so that the desired receiving frequency fs is restored at the step (9) in FIG. 5, followed by the search downward to the lower-limit frequency $fs_{min}$ (88.3 MHz) in a manner similar but opposite to the steps (1) to (8) in FIG. 5. The frequency dividing value $No_{min}$ (990) corresponding to the lower-limit frequency $fs_{min}$ (88.3 MHz) of the receiving band is stored in advance in the memory section 130b of the memory unit 130. In FIG. 5, the steps (10) to (16) correspond to the steps (2) to (8) mentioned above and will not be described in detail.

These operations are performed by the program section 120 having in store the data related thereto. The memory sections 130e and the like other than the sections 130a to 130d of the memory unit 130 are used as a working area for the processing section 110.

FIG. 7 shows a diagram illustrating the above-mentioned frequency search operation. In this drawing, the parts similar to those in FIG. 3 are denoted by reference numerals similar to those in FIG. 3 respectively and will not be described in detail.

In this embodiment, assume that the gain of the gain control device 15 is reduced by, say, 5 dB. All the input levels of the radio frequency amplifier circuit 3 and the mixer circuit 6 are reduced also by 5 dB. The magnitude of the intermodulation is proportional to $v_1^2 \cdot v_2$ or $v_1 \cdot v_2^2$ as shown by equations (3) and (4). In view of the fact that each of $v_1$ and $v_2$ is reduced by 5 dB, $v_1^2 \cdot v_2$ or $v_1 \cdot v_2^2$ is reduced by 15 dB, thus achieving a great improvement.

This embodiment is described above with reference to the case in which the central frequency of an interference wave due to intermodulation occurs at the central frequency of the desired wave for convenience of explanation. Since every broadcasting signal is modulated, however, the desired wave may be affected even when the central frequency of an interference wave fails to coincide with the central frequency of the desired wave. At the step (6) or (14) in FIG. 5, therefore, the frequency search described above is preferably made not only for the interference frequency (No±2ΔN) causing an intermodulation with the receiving frequency but also for the frequencies in the vicinity of the interference frequency. This can be performed by appropriately changing the program of the program section 120.

The foregoing description of the embodiment concerns the case in which the gain is controlled by the presence or absence of the output of the level detector 14. In view of the fact that intermodulation poses a problem only when an interference wave is higher than a certain level in intensity, it is necessary for the level detector 14 to respond only to an input wave higher than a certain level in intensity.

FIG. 8 is a block diagram showing another embodiment of the present invention. In this drawing, reference numerals 141, 142 and 143 show comparators, the reference levels of which are set at different values by a power supply 148 and a plurality of resistors 144 to 147. In this way, the level detector 14 is comprised of a plurality of comparators 141, 142 and 143, so that the gain control of the gain control device 15 is capable of being performed in a more in finely controlled manner. For example, as shown in FIG. 9, the amount of gain control can be changed among "0", "1", "2" and "3" in accordance with the receiving frequency, where the figures such as "0" and "1" indicate the amount of gain control in the form of degree of attenuation. Numeral 17 shows a muting circuit inserted in the stage immediately subsequent to the FM detector 9 and connected to the mute output terminal $O_3$ of the control unit 10. This muting circuit 17 performs a muting operation, that is, prevents the receiver from producing a sound in response to a mute signal produced at the mute output terminal $O_3$ of the control unit 10 during the processing of the program in FIG. 5. The muting operation which is well known will not be described. Numeral 18 is a switch connected to the control unit 10 for switching the processing operation shown in the above-mentioned embodiment of the control unit 10. This switch is so constructed that when it is turned on together with the control unit 10, the control unit 10 causes the tuning operation to be performed according to the steps shown in FIG. 5, and when the switch 18 is turned off, the operation of the step (1) in FIG. 5, namely, the tuning and receiving of the frequency of the designated broadcasting station alone is performed. In this configuration, the tuning (receiving) of the desired broadcasting station (frequency) can be accomplished efficiently for the reasons mentioned below. It is not efficient to perform the processing based on the programs of FIG. 5 each time the tuning is made to the desired broadcasting station. All the desired broadcastings do not cause an intermodulation with other broadcastings, and the user preferably wants to omit the processing of FIG. 5. Thus by turning on and off the switch 18 thereby to change the processing operation of the control unit 10 in accordance with the desired broadcasting, therefore, a desired broadcasting can be efficiently selected. The remaining parts of the configuration are the same as those of the embodiment of FIG. 3 and will not be described.

FIG. 10 is a block diagram of the control unit according to the present invention in which the gain is controlled by use of a channel preset memory of a radio receiver having what is called a memory preset function whereby a plurality of receiving frequencies are stored in the memory and the desired receiving frequency is read out of the memory. In this drawing, numeral 10' is a control unit connected to the programmable divider 54 of the total oscillator circuit 5 for controlling the frequency dividing ratio N thereof. This control unit 10' comprises a calculation processing section 110' for performing the processing operation as shown in FIG. 11 and a channel preset memory 130'. In the case where the control unit 10' is comprised of a microcomputer such as the μPD1704C made by Nippon Electric Co., Ltd., the memory 130' may be installed either outside or inside of the microcomputer. Numeral 11' shows a keyboard including a tuning key S, a memory key W and a plurality of channel preset keys R. The other parts are the same as those included in the embodiment of FIG. 3 and therefore will not be shown or described.

In this configuration, the case in which a desired frequency is selected and preset will be described with reference to the block diagram of FIG. 11. By operating the tuning key S of the keyboard 11', the radio receiver is tuned to the desired frequency fs. The memory key W is operated and then one of the channel preset keys R is operated. The calculation processing section 110' decides that the above-mentioned operations are a write (preset) command on the basis of the step (2) of FIG. 11, so that at the step (3) such processes as the calculation of the frequency-dividing value No corresponding to the tuned frequency fs the program of FIG. 5 and the search for any intermodulation are performed, thus determining whether or not the gain control of the receiver is required. At the step (5), such data as the frequency-dividing value No and the result of decision on whether or not the gain control is required are stored in the frequency data section (A) and the gain control requirement data section (B) respectively of the channel corresponding to the channel preset key of the memory 130'. In the absence of an intermodulation interference when the desired receiving frequency fs is received and preset, the value No corresponding to the receiving frequency and "0" indicative of the absence of need of gain control are stored in the memory 130'. In the presence of an intermodulation interference, in contrast, the value No and "1" indicative of the need of gain control are stored in the memory 130'. These operations are carried out at the time of presetting the receiving frequency, as a specific example is shown in FIG. 12.

Next, the case in which the data preset is read out is described. When one of the channel preset keys R of the keyboard 11' such as the one corresponding to the channel 2 in FIG. 12 is operated, the calculation processing section 110' decides that this operation is a read command at the step (2) in FIG. 11, thus reading out gain attenuation data "1" together with No=99 corresponding to the receiving frequency 88.7 MHz. The value No=994 thus read out is applied to the programmable divider 54, and the gain attenuation data "1" is applied to the gain control unit 15, thereby making it possible to receive the preset frequency.

As will be seen from the aforementioned embodiment, it is determined whether or not the gain control is necessary at the time of presetting the desired receiving frequency, and the resulting data is stored together with the receiving frequency in the memory 130'. In this way, at the time of selection (reading out) of a predetermined channel, the gain control unit 15 is capable of being controlled by the data of (B) in the memory 130' without the step (3) in FIG. 11 or the steps in FIG. 5.

FIG. 12 shows a case in which the on-off control of the gain is performed. When channel 2 is selected, for instance, the frequency of 88.7 MHz is involved and the gain is reduced. When channel 1 is selected, on the other hand, the frequency of 88.3 MHz is involved and the gain is not controlled. The amount of gain control (amount of attenuation) is preferably differentiated according to the conditions of the interference signal for each channel.

I claim:
1. In a radio receiver including tuning means, receiving means for receiving transmitted signals and for applying the received signals to said tuning means, control means connected to said tuning means for controlling the tuning frequency of said tuning means, level detector means connected to receive the signals passed by said tuning means for detecting whether those signals exceed a predetermined level and for supplying a resulting detection output signal to said control means, and gain control means responsive to said control means for controlling the level of said received signals;

said control means including processing means connected to said tuning means, said level detector means and said gain control means for determining, when a desired broadcast frequency is received by said receiving system, whether there exists any other broadcast frequency which interferes with said desired broadcast frequency, program means connected to said processing means for controlling the operation thereof; memory means connected to said processing means for storing the result of the operations thereof, and a keyboard connected to said processing means for designating a desired receiving frequency (fs); said processing means including first generating means for generating a desired tuning control signal (No) corresponding to a desired receiving frequency (fs) and for storing the desired tuning control signal in said memory means when said desired receiving frequency (fs) is designated by way of said keyboard, second generating means for generating and successively applying to said tuning means a tuning control signal (N) corresponding to each frequency over the entire receiving band of said tuning means except for said desired receiving frequency (fs), means for determining on the basis of the output of said level detector means whether there exists an interference broadcasting wave in such a relation with said desired receiving frequency as to interfere with the same among the frequencies selected by said tuning control signal (N) and for applying a gain control signal to said gain control means to attenuate said received signals when there exists said interference broadcasting wave, and desired tuning control signal supply means responsive to completion of the operation of said interference broadcasting wave determining means for reading out the desired tuning control signal (No) stored in said memory means and for applying said signal (No) to said tuning means, thereby enabling the receipt of the desired receiving frequency (fs).

2. In a radio receiver including tuning means, receiving means for receiving transmitted signals and for applying the received signals to said tuning means, control means connected to said tuning means for controlling the tuning frequency of said tuning means, level detector means connected to receive the signals passed by said tuning means for detecting whether those signals exceed a predetermined level and for supplying a resulting detection output signal to said control means, and gain control means responsive to said control means for controlling the level of said received signals, said control means including processing means connected to said tuning means, said level detector means and said gain control means for determining, when a desired broadcast frequency is received by said receiving system, whether there exists any other broadcast frequency which interferes with said desired broadcast frequency, program means connected to said processing means for controlling the operation thereof, memory means connected to said processing means for storing the result of operations thereof, and a keyboard connected to said processing means for designating a desired receiving frequency (fs);

said processing means including first generating means for generating a desired tuning control signal (No) corresponding to a desired receiving frequency (fs) and for storing the desired tuning control signal in said memory means when said desired receiving frequency (fs) is designated by way of said keyboard, second generating means for generating and successively applying to said tuning means a tuning control signal (N) corresponding to each frequency over the entire receiving band of said tuning means, means for determining on the basis of the output of said level detector means whether there exists an interference broadcasting wave in such a relation with said desired receiving frequency as to interfere with the same among the frequencies selected by said tuning control signal (N), means for applying a gain control signal to said gain control means to attenuate said received signals when there exists said interference broadcasting wave, means for storing said gain control signal in said memory means in accordance with said tuning control signal (No), and control signal supply means for reading out and applying to said tuning means said gain control signal and the desired tuning control signal (No) stored in said memory means, thereby enabling the receipt of the desired receiving frequency (fs).

3. A radio receiver according to claims 1 or 2, wherein said level detector means includes a reference voltage source, and a level comparator for comparing the voltage level of said voltage source with the receiving signal level of the signals passed by said timing means, said comparator being actuated when said receiving signal level exceeds said voltage level.

4. A radio receiver according to claims 1 or 2, wherein said gain control means includes an impedance circuit connected to receive the output of said receiving means, the impedance value of said impedance circuit being changed in response to the gain control signal from said processing means, thereby attenuating the level of said received signals.

5. A radio receiver according to claim 4, wherein said control circuit includes display means for indicating the presence of any other broadcasting wave having an interference relation with the receiving frequency in response to the gain control signal from said processing means.

6. A radio receiver according to claims 1 or 2, wherein said control means further includes switching means for selectively tuning on and off the gain control processing operation of said gain control means.

7. A radio receiver according to claims 1 or 2, wherein said interference broadcasting wave determining means includes first means responsive to the output of said level detector means indicating receipt of a broadcasting wave of at least predetermined level at a frequency selected by said tuning control signal (N) for calculating the interference frequency based on that frequency (N) for the desired receiving frequency (fs), second means responsive to said first means for generating a tuning control signal corresponding to said calculated interference frequency and for applying that generated tuning control signal to said tuning means, and third means for determining whether said interference broadcasting wave exists on the basis of the output of said level detector means with said tuning means being controlled by said second means.

8. A radio receiver according to claims 1 or 2, further including mixer means connected to the output of said tuning means for producing an intermediate frequency signal, a detector connected to receive said intermediate frequency signal and muting means for inhibiting the output of said detector, said processing means including means for actuating said muting means during the time of operation of said second generating means and said determining means.

* * * * *